(12) United States Patent
Matsuura et al.

(10) Patent No.: US 8,816,338 B2
(45) Date of Patent: *Aug. 26, 2014

(54) ELECTRODE FOIL AND ORGANIC DEVICE

(75) Inventors: Yoshinori Matsuura, Kawagoe (JP); Nozomu Kitajima, Ageo (JP); Naohiko Abe, Ageo (JP)

(73) Assignee: Mitsui Mining & Smelting Co., Ltd., Shinagawa-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/696,684

(22) PCT Filed: Mar. 1, 2011

(86) PCT No.: PCT/JP2011/054628
§ 371 (c)(1),
(2), (4) Date: Nov. 7, 2012

(87) PCT Pub. No.: WO2011/152092
PCT Pub. Date: Dec. 8, 2011

(65) Prior Publication Data
US 2013/0048976 A1 Feb. 28, 2013

(30) Foreign Application Priority Data
Jun. 4, 2010 (JP) .................. 2010-129083

(51) Int. Cl.
| H01L 23/48 | (2006.01) |
| H01L 51/00 | (2006.01) |
| C25D 7/06 | (2006.01) |
| H05B 33/26 | (2006.01) |
| H01L 51/50 | (2006.01) |
| C25D 5/48 | (2006.01) |
| H01L 51/52 | (2006.01) |
| H01L 51/44 | (2006.01) |

(52) U.S. Cl.
CPC ..... *H01L 51/5203* (2013.01); *H01L 2251/5315* (2013.01); *C25D 7/0614* (2013.01); *H05B 33/26* (2013.01); *H01L 2251/55* (2013.01); *H01L 51/5012* (2013.01); *C25D 5/48* (2013.01); *H01L 51/0097* (2013.01); *Y02E 10/549* (2013.01); *H01L 51/5221* (2013.01); *H01L 2251/5353* (2013.01); *H01L 51/441* (2013.01)
USPC  257/40; 257/734; 257/E23.01; 257/E51.001; 257/E51.019

(58) Field of Classification Search
USPC ........ 257/40, 734, E51.001, E51.019, E23.01
See application file for complete search history.

(56) References Cited

U.S. PATENT DOCUMENTS 8,575,834 B2 * 11/2013 Wada et al. .................. 313/504
8,586,976 B2 * 11/2013 Matsuura et al. ............... 257/40

(Continued)

FOREIGN PATENT DOCUMENTS

| JP | 2001-270036 A1 | 10/2001 |
| JP | 2002-015859 A1 | 1/2002 |

(Continued)

OTHER PUBLICATIONS

International Search Report and Written Opinion dated Jun. 7, 2011 (with English translation).

(Continued)

*Primary Examiner* — Victor A Mandala
(74) *Attorney, Agent, or Firm* — Burr & Brown, PLLC

(57) ABSTRACT

There are provided an electrode foil which has all the functions of a supporting base material, an electrode and a reflective layer and also has a superior thermal conductivity; and an organic device using the same. The electrode foil comprises a metal foil, wherein the electrode foil has at least one outermost surface which is an ultra-smooth surface having an arithmetic average roughness Ra of 10.0 nm or less as measured in accordance with JIS B 0601-2001.

15 Claims, 5 Drawing Sheets

(56) References Cited

U.S. PATENT DOCUMENTS

| | | |
|---|---|---|
| 2003/0027050 A1* | 2/2003 | Okamoto et al. ........ 429/231.95 |
| 2003/0218153 A1 | 11/2003 | Abe |
| 2005/0005964 A1 | 1/2005 | Komatsu |
| 2005/0224766 A1 | 10/2005 | Abe |
| 2006/0219988 A1 | 10/2006 | Abe |
| 2006/0284143 A1 | 12/2006 | Abe |
| 2007/0222370 A1 | 9/2007 | Zhu et al. |
| 2010/0038115 A1 | 2/2010 | Matsuda et al. |
| 2010/0230667 A1 | 9/2010 | Nakamura et al. |
| 2011/0070456 A1 | 3/2011 | Philippens et al. |
| 2014/0048791 A1* | 2/2014 | Matsuura et al. ............... 257/40 |

FOREIGN PATENT DOCUMENTS

| | | |
|---|---|---|
| JP | 2004-006221 A1 | 1/2004 |
| JP | 2004-087451 A1 | 3/2004 |
| JP | 2006-269224 A1 | 10/2006 |
| JP | 2006-331674 | 12/2006 |
| JP | 2006-331694 A1 | 12/2006 |
| JP | 2007-217787 A1 | 8/2007 |
| JP | 2007-536697 A1 | 12/2007 |
| JP | 2008-142970 A1 | 6/2008 |
| JP | 2008-243772 | 10/2008 |
| WO | 2009/060916 A1 | 5/2009 |
| WO | 2010/000226 A1 | 1/2010 |

OTHER PUBLICATIONS

Japanese Office Action dated Jul. 3, 2012 (with English translation).
Taiwanese Office Action (With English Translation), dated Jul. 8, 2013 (5 pages).
Taiwanese Office Action mailed Jan. 14, 2014 (with English Translation), Taiwanese Application No. 100107337 (7 pages).
Extended European Search Report (Application No. 11789504.5) dated May 14, 2014.

* cited by examiner

ELECTRODE FOIL AND ORGANIC DEVICE

CROSS-REFERENCE TO RELATED APPLICATION

This application claims priority to Japanese Patent Application No. 2010-129083 filed on Jun. 4, 2010, the entire disclosure of which is incorporated herein by reference.

BACKGROUND OF THE INVENTION

1. Field of the Invention

The present invention relates to an electrode foil using a metal foil, and to an organic device using the electrode foil, such as an organic EL element, an organic EL lighting, an organic solar cell or the like.

2. Description of the Related Art

In recent years, organic EL lighting has been drawing attention as an eco-friendly green device. Features of the organic EL lighting include: 1) a low power consumption as compared with an incandescent lamp; 2) a thin profile and light weight; and 3) a flexibility. At the moment, the organic EL lightings are being developed so as to attain the above features of 2) and 3). In this respect, glass substrates that have been conventionally used in flat panel displays (FPD) are unable to attain the above features of 2) and 3).

In view of this, there are researches being conducted on a substrate as a support (hereinafter, "supporting base material") for organic EL lighting, proposing an ultra-thin glass, a resin film, a metal foil or the like as a possible supporting base material. The ultra-thin glass is superior in heat resistance, barrier performance and optical transparency and has good flexibility, but is somewhat inferior in handling and has low thermal conductivity and high material cost. Further, the resin film is superior in handling and flexibility and has low material cost and good optical transparency, but is inferior in heat resistance and barrier performance and has low thermal conductivity.

In contrast, apart from the absence of optical transparency, the metal foil has excellent features such that it is superior in heat resistance, barrier performance, handling, and thermal conductivity and also has good flexibility and low material cost. In particular, a typical flexible glass or film has an extremely low thermal conductivity of 1 W/m° C. or lower, while a copper foil has an extremely high thermal conductivity of around 280 W/m° C. However, in order to use the metal foil as a supporting base material for flexible electronic devices, the surface of the metal foil needs to be covered with an insulating film.

For instance, Patent Literature 1 discloses an organic light-emitting device comprising a lower electrode layer, an organic layer, and an upper electrode layer on a flexible substrate, describing that a metal foil that may be covered with an insulating film can be used as the flexible substrate.

Patent Literature 2 discloses an insulator-coated metal foil for flexible electronic devices, which comprises a stainless steel foil having a surface roughness Ra of from 30 nm to 500 nm. The metal foil, of which the surface is coated with the insulator film, is used as a supporting base material for forming thereon an electronic device, such as thin film transistor (TFT).

Patent Literature 3 discloses a flexible metal foil laminate comprising a metal foil having a surface roughness Ra of about 0.2 μm or less and a heat-adhesive polyimide coating laminated on the surface the metal foil.

Patent Literature 4 discloses an electrolytic copper foil having a surface roughness (Rzjis) of less than 1.0 μm on the deposition side thereof so as to attain a low profile on the surface to be bonded to an insulator-layer constituent material. However, the surface roughness (Rzjis) disclosed in this literature is 0.27 μm at best.

CITATION LIST

Patent Literature

[Patent Literature 1] JP2007-536697A
[Patent Literature 2] JP2008-142970A
[Patent Literature 3] JP2001-270036A
[Patent Literature 4] JP2007-217787A

SUMMARY OF INVENTION

The inventors have currently found that extremely smoothing at least one surface of a metal foil enables attainment of an electrode foil useful for flexible electronic devices, which has all the functions of a supporting base material, an electrode and a reflective layer and also has a superior thermal conductivity.

It is thus an object of the present invention to provide an electrode foil useful for flexible electronic devices, which has all the functions of a supporting base material, an electrode and a reflective layer and also has a superior thermal conductivity.

According to an aspect of the present invention, there is provided an electrode foil comprising a metal foil, wherein the electrode foil has at least one outermost surface which is an ultra-smooth surface having an arithmetic average roughness Ra of 10.0 nm or less as measured in accordance with JIS B 0601-2001.

According to another aspect of the present invention, there is provided an organic device which is an organic EL element and/or an organic solar cell, the organic device comprising:
  the above electrode foil;
  an organic semiconductor layer comprising an organic EL layer and/or an organic solar cell active layer, the organic semiconductor layer being provided directly on the outermost surface on or to the side of the ultra-smooth surface of the electrode foil; and
  a transparent or translucent counter electrode provided on the organic semiconductor layer.

According to still another aspect of the present invention, there is provided an organic EL lighting comprising the above organic device as an organic EL element.

DETAILED DESCRIPTION OF THE INVENTION

Electrode Foil

Figure 1:
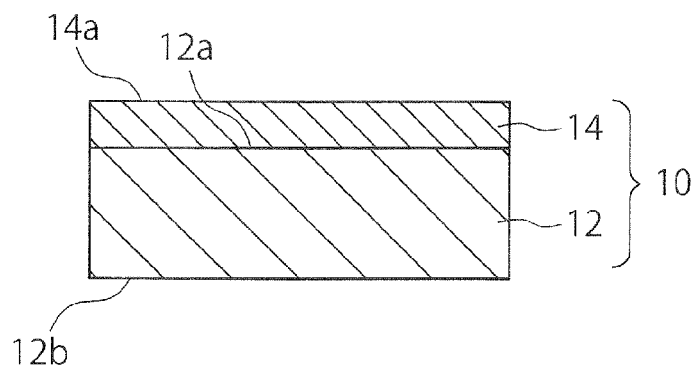
FIG. 1 is a schematic cross-sectional view illustrating an example of the electrode foil according to the present invention.

FIG. 1 shows a schematic cross-sectional view of an example of the electrode foil according to the present invention. The electrode foil 10 shown in FIG. 1 comprises a metal foil 12; and optionally a buffer layer 14 provided directly on the metal foil. Although the electrode foil 10 has a two-layer structure composed of the metal foil 12 and the buffer layer 14, the electrode foil of the present invention is not limited thereto but may be a one-layer structure composed of the metal foil 12. At least one of the outermost surfaces of the electrode foil 10 is an ultra-smooth surface having an arithmetic average roughness Ra of 10.0 nm or less, preferably 7.0 nm or less, more preferably 5.0 nm or less, further preferably 3.0 nm or less, furthermore preferably 2.5 nm or less, particularly preferably 2.0 nm or less, and most preferably 1.5 nm or less. The lower limit of the arithmetic average roughness Ra is not particularly limited but may be 0 (zero). However, considering efficiency of surface smoothing treatment, 0.5 nm may be considered the lower limit. The arithmetic average roughness Ra may be measured in accordance with JIS B 0601-2001 by using a commercially available surface roughness meter.

The expression "at least one outermost surface of the electrode foil 10" denotes the surface 12a of the metal foil 12 in the case of the one-layer structure or the surface 14a of the buffer layer 14 in the case of the two-layer structure. The aforementioned arithmetic average roughness Ra of the surface 14a of the buffer layer 14 in the case of the two-layer structure may be attained by providing the surface 12a of the metal foil 12 for the buffer layer 14 to be formed thereon with an arithmetic average roughness Ra in a range similar to those mentioned above, namely, 10.0 nm or less, preferably 6.0 nm or less, more preferably 3.0 nm or less, still more preferably 2.0 nm or less, and still more preferably 1.5 nm or less; and forming a buffer layer 14 thereon. The surface 14a of the buffer layer 14 thus formed has an arithmetic average roughness Ra of 10.0 nm or less, preferably 7.0 nm or less, more preferably 5.0 nm or less, still more preferably 3.0 nm, particularly preferably 2.5 nm or less, and particularly more preferably 2.0 nm or less. As described above, it is preferred that the surface of the metal foil underneath the outermost surface be provided with an arithmetic average roughness Ra equivalent to or somewhat smaller than an arithmetic average roughness Ra to be provided on the outermost surface. The arithmetic average roughness Ra of the metal foil surface not constituting the outermost surface due to the lamination state may be evaluated by creating a cross section from the metal foil surface by FIB (Focused Ion Beam) processing; and observing the cross section with a transmission electron microscope (TEM). Using the electrode foil or metal foil having such an ultra-smooth surface makes it possible to provide an electrode foil which combines three functions as a supporting base material, an electrode and a reflective layer, unlike conventional metal foils that have been used as a supporting base material with its surface being coated with an insulator layer. The electrode foil of the present invention thus makes it possible to dispense with a supporting base material and a reflective layer that have been needed in conventional top-emission type flexible light-emitting devices. Accordingly, the electrode foil of the present invention is free from an insulator layer at least on or to the side of the ultra-smooth layer, and preferably is free from an insulator layer at any position.

As far as the present inventors are aware, a metal foil (particularly, a copper foil) having the aforementioned ultra-smooth surface has not been industrially produced to date, nor has there been any attempt to apply the metal foil to an electrode itself of flexible electronic devices. A copper foil with a smoothed surface is commercially available, but such a surface smoothness level of the copper foil is not sufficient for organic EL element electrodes in that incorporating the foil to prepare an organic EL element may result in short circuit due to the unevenness and thus fails to provide light emission.

In contrast, since the arithmetic average roughness Ra of the ultra-smooth surface of the electrode foil or the metal foil according to the present invention is extremely small as described above, short circuit would not occur between the foil and a counter electrode or the like, even if the foil is used as an organic EL element electrode. Moreover, ultra-smoothing significantly improves absolute reflectivity on the metal foil surface over the entire wavelength region, and thus makes it possible to dispense with a reflective layer that have been needed in top-emission type light-emitting devices. Such an ultra-smooth surface may be attained by polishing the metal foil with CMP (Chemical Mechanical Polishing) treatment. CMP treatment may be performed by using a known polishing liquid and a known polishing pad under known conditions. A preferable polishing liquid may comprises one or more of polishing granules selected from ceria, silica, alumina, zirconia, and others in an amount of from about 0.5 to about 2 wt %; an oxidizing agent such as benzotriazole (BTA); and/or an organic complex forming agent such as quinaldic acid, quinolinic acid, and nicotinic acid; a surfactant such as a cationic surfactant and an anionic surfactant; and optionally an anticorrosive agent. A preferable polishing pad is a pad made of urethane. The polishing conditions are not particularly limited as pad rotation speed, work load, coating flow rate of polishing liquid may be adequately regulated. It is preferable that the rotation speed be regulated in the range of from 20 rpm to 1,000 rpm, that the work load be regulated in the range of from 100 gf/cm$^2$ to 500 gf/cm$^2$, and that a coating flow rate of the polishing liquid be regulated in the range of from 20 cc/min to 200 cc/min.

The ultra-smooth surface 12a may be attained by polishing metal foil 12 using electrolytic polishing, buff polishing, chemical polishing, or a combination thereof. Chemical polishing is not particularly limited as it may be performed by adequately adjusting a chemical polishing solution, the temperature of the chemical polishing solution, dipping time in the chemical polishing solution, and the like. For instance, chemical polishing of copper foil may be performed by using a mixture of 2-aminoethanol and ammonium chloride. The temperature of the chemical polishing solution is preferably room temperature, while dipping method (Dip process) is preferably used. Further, dipping time in the chemical polishing solution is preferred to be from 10 to 120 seconds, more preferably from 30 to 90 seconds since long dipping time tends to result in degradation of smoothness. The metal foil after chemical polishing is preferred to be cleansed with running water. This smoothing treatment can smooth the surface having an arithmetic average roughness Ra of about 12 nm to have an Ra of 10.0 nm or less, for instance, about 3.0 nm.

The ultra-smooth surface 12a may also be attained by a technique such as a method of polishing the surface of the metal foil 12 by blasting or a method of melting the surface of the metal foil 12 by laser, resistance heating, lamp heating or the like and then rapidly cooling the surface of the metal foil 12. In the case of using as the metal foil 12 a foil metal made of a metal such as copper, nickel, and chromium that are capable of being plated, the ultra-smooth surface may also be attained by using a transfer method. The transfer method may be conducted in accordance with known techniques and known conditions. For instance, the surface of an electrode plate such as SUS and titanium is smoothed by electrolytic polishing and buff polishing so as to be provided with an arithmetic average roughness Ra of 10.0 nm or less, for instance, 3.0 nm or less. The surface of the metal plate thus smoothed was plated with the material of metal foil 12, which is peeled off from the electrode plate when a desired thickness is attained. In this way, by transferring the smoothness of the electrode plate surface to the peeled face of the metal foil 12, an ultra-smooth surface can be attained.

The metal foil 12 is not particularly limited as long as the metal foil is a foil-like metallic material that has a strength required for a supporting base material, electrical properties required for an electrode and light reflective properties acceptable as a reflective layer. A preferred metal foil is a nonmagnetic metal foil from the view point of preventing magnetic adherence of particles produced on machining. Examples of the nonmagnetic metal preferably include copper, aluminum, nonmagnetic stainless steel, titanium, tantalum, and molybdenum, and more preferably copper, aluminum, and nonmagnetic stainless steel. The most preferable metal foil is copper foil.

The most preferable metal foil is copper foil. Copper foil is relatively inexpensive as well as excellent in strength, flexibility, and electrical properties. In addition, when a warm white light with a color temperature of about 3000 K is required as organic EL lighting, copper foil can rather reflect an optimally colored light in the absence of a reflective layer. This is because copper foil has a characteristic that absolute reflectivity becomes relatively lower in the blue wavelength region than in the other wavelength region.

The thickness of the metal foil 12 is not particularly limited as long as the metal foil does not lose flexibility and can be handled solely in itself, but may be in the range of from 1 μm to 250 μm, preferably from 25 μm to 250 μm, and more preferably from 35 μm to 150 μm. With such thickness, cutting may be performed easily by using a commercially available cutting machine. In addition, unlike glass substrates, the metal foil 12 has no problems such as crack, chip or the like, and also has an advantage of not easily producing particles upon cutting. The metal foil 12 may be formed in various shapes other than tetragon, such as circle, triangle, and polygon, and can also be cut-and-pasted to prepare a light emitting body in a three-dimensional shape such as a cubic shape or a ball shape since the metal foil is capable of being cut or welded. In this case, it is preferred that a light emitting layer be not formed at a cutting or welding portion of the metal foil 12.

The ultra-smooth surface 12a is preferably cleansed with an alkaline solution. A known alkaline solution such as an ammonia-containing solution, a sodium hydroxide solution, and a potassium hydroxide solution may be used as the alkaline solution. The alkaline solution is preferably an ammonia-containing solution, more preferably an organic alkaline solution containing ammonia, further preferably a tetramethylammonium hydroxide (TMAH) solution. Preferable concentration of the TMAH solution is from 0.1 wt % to 3.0 wt %. An example of washing described above includes performing cleansing at 23° C. for one minute with use of a 0.4% TMAH solution. A similar cleansing effect can also be attained by performing UV (Ultra Violet) treatment in combination with or in place of the alkaline solution. In addition, in the case of copper foil and the like, it is possible to remove oxides formed on the copper surface by using an acidic cleansing solution such as dilute sulfuric acid. An example of acid cleansing includes performing cleansing for 30 seconds with dilute sulfuric acid.

Prior to the formation of the reflective layer 13, it is preferred that particles on the ultra-smooth surface 12a be removed. Examples of an effective method for removing the particles include a sonic washing method using ultra-pure water and a dry-ice blasting method. The dry-ice blasting method is more effective. Dry-ice blasting method is a method of ejecting carbon dioxide gas compressed at high pressure through a fine nozzle and thereby blowing carbon dioxide solidified at low temperature against the ultra-smooth surface 12a to remove the particles. Unlike wet process, this dry-ice blasting method can dispense with drying process, and also has an advantage of being able to remove organic substances. The dry-ice blasting method may be performed by using a commercially available apparatus such as a dry-ice snow system (manufactured by AIR WATER INC.).

It is preferred that the buffer layer 14 be provided directly on the metal foil 12. The buffer layer 14 is not particularly limited as long as it makes contact with an organic EL layer in an organic EL element to improve hole injection efficiency or electron injection efficiency as well as to provide a desired work function. Nonetheless, the buffer layer in the present invention is preferably transparent or translucent from the viewpoint of enabling the metal foil to function as a reflective layer.

The buffer layer 14 is preferably at least one selected from the group consisting of an conductive amorphous carbon film, an conductive oxide film, a magnesium alloy film, and a fluoride film, and may be selected as needed depending on applications such as an anode or a cathode and required performances.

As the conductive amorphous carbon film, various kinds of amorphous carbon films provided with electrical conductivity by regulating hydrogen concentration or impurity concentration may be used. Formation of the conductive amorphous carbon film is preferred to be conducted by sputtering. A carbon target subjected to purification treatment is desired to be used for the sputtering. In addition, porous carbon impregnated with B, Si, Al and/or Cu may be used.

A preferable conductive amorphous carbon film is composed of an conductive amorphous carbon having a hydrogen concentration of 15 at % or less. The hydrogen concentration is more preferably 12 at % or less and further preferably 5 at % or less. Although the lower limit of the hydrogen concentration is not particularly limited but may be 0 (zero), a typical lower limit may be 3 at % in consideration of unavoidable contamination with hydrogen from film forming environment upon sputtering. The hydrogen concentration in the buffer layer may be measured by various known methods, among which HFS (Hydrogen Forward Scattering) is preferred. The hydrogen concentration in the conductive amorphous carbon film is defined herein as a hydrogen concentration obtained by measuring the amounts of carbon and hydrogen by HFS or the like and assuming the total amount of these atoms as 100 at %. Making the hydrogen concentration extremely low in this way makes it possible to avoid decrease in electrical conductivity or development of insulating character, which are caused by the carbon atoms constituting the buffer layer being terminated with hydrogen, and thus to provide the buffer layer with a high electrical conductivity required for an electrode. Therefore, it is preferable that the conductive amorphous carbon be not substantially doped with impurities other than carbon and hydrogen. The phrase "not substantially doped" means that impurities are not intentionally added for the purpose of providing a certain function, allowing impurities unavoidably incorporated from film forming environment or the like during sputtering. In view of this, the conductive amorphous carbon in the present invention preferably has an oxygen concentration of from 0 wtppm to 300 wtppm, a halogen element concentration of from 0 wtppm to 1,000 wtppm, and a nitrogen concentration of from 0 ppm to 500 ppm. The thickness of the buffer layer 14 is not particularly limited, but preferably from 3 nm to 30 nm, more preferably from 3 nm to 15 nm, and further preferably from 5 nm to 10 nm.

A preferable conductive oxide film may be composed of one or more selected from the group consisting of $InO_x$, $SnO_x$, $ZnO_x$, $MoO_x$, $GaO_x$, $VO_x$, $WO_x$, $RuO_x$, $AlO_x$, $TiO_x$, and $GeO_x$. Typical examples thereof include ITO (indium tin oxide) and IZO (indium zinc oxide). The conductive oxide film may be formed by using a known technique such as sputtering and vacuum deposition, preferably DC magnetron sputtering. The target material used for sputtering may be prepared by hot pressing or cold pressing, so that the oxides described above may be combined together as needed to attain desired characteristics.

A preferable magnesium alloy film may be composed of an alloy comprising Mg and one or more additive selected from the group consisting of Ag, Al, Zn, Li, Y, and Ca. The magnesium alloy film may be formed by using a known technique such as sputtering method or vacuum deposition method, preferably vacuum deposition method.

A preferable fluoride film may be composed of one or more selected from the group consisting of LiF, $MgF_2$, $CaF_2$, $AlF_3$, $Na_3AlF_6$, and $NaF_6$. The fluoride film may be formed by using a known technique such as sputtering method or vacuum deposition method, preferably vacuum deposition method.

The surface 14a of the buffer layer 14 has an arithmetic average roughness Ra of 10.0 nm or less, preferably 7.0 nm or less, more preferably 5.0 nm or less, further preferably 3.0 nm or less, furthermore preferably 2.5 nm or less, particularly preferably 2.0 nm or less. As described above, the buffer layer is formed on the ultra-smooth surface of the metal foil, so that the arithmetic average roughness Ra may be reduced also on the surface of the buffer layer to realize a high smoothness. This makes it possible to reduce the risk of short circuit in the organic EL layer, which arises from generation of excess unevenness. In addition, a hole injection layer and a hole transport layer or an electron injection layer and an electron transport layer are not needed to be formed thick so as to eliminate the influence of unevenness of the buffer layer surface. Therefore, these layers and an organic EL layer that includes these layers may be made thinner than usual. As a result, the amount of extremely expensive organic raw materials to be used is reduced to lower production cost, while the organic EL layer can be thinned to increase light-emitting efficiency.

The electrode foil of the present invention has a thickness of preferably from 1 μm to 300 μm, more preferably from 25 μm to 250 μm, further preferably from 35 μm to 150 μm, most preferably from 40 μm to 100 μm.

According to a preferred embodiment of the present invention, the surface 12b of the metal foil 12 opposite to the ultra-smooth surface 12a may be roughened to a ten-point average roughness Rz of 1.0 μm or more, more preferably 2.0 μm or more, and further preferably 5.0 μm or more. The ten-point average roughness Rz may be measured in accordance with ITS B 0601-1994 with a commercially available roughness meter available. The surface may be roughened preferably by using a known technique such as dry-ice blasting, sand blasting, wet etching, dry etching, or the like. The unevenness provided on the roughened surface can improve heat discharge characteristics.

The electrode foil of the present invention is metal-foil based, so that the electrode foil can be produced efficiently, for example, by roll-to-roll process without particularly necessitating a supporting base material.

The electrode foil of the present invention may be used preferably as an anode or a cathode (particularly, a reflective electrode) for various kinds of flexible electronic devices (particularly, flexible light-emitting or power generating devices). Examples of such flexible electronic devices include organic EL elements; organic EL lighting; organic EL displays; electronic paper; thin-film solar cells; liquid crystal displays; inorganic EL elements; inorganic EL displays; LED lighting; and LED displays. Preferred are organic EL elements, organic EL lighting, organic EL displays, organic solar cells, and dye-sensitized solar cells. Organic EL lighting is more preferable in that high brightness is attained in an ultra-thin form. In addition, since many of characteristics required for electrode materials of organic solar cells are in common with those required for organic EL elements, the electrode foil of the present invention may be preferably used as an anode or a cathode of organic solar cells. Namely, appropriate selection of the kind of an organic semiconductor layer to be laminated on the electrode foil of the present invention in accordance with known techniques makes it possible to construct an organic device in any form of an organic EL element and an organic solar cell. It is also possible to form a light-emitting element and a power generating element simultaneously on the same electrode, and thereby to fabricate a composite device that has both functions of an organic EL element and an organic solar cell. Furthermore, the electrode foil of the present invention may be used not only as an electrode of an organic EL element but also as an LED mounting board. In particular, the electrode foil of the present invention may be preferably used as an anode or a cathode of LED lighting in that LED elements can be mounted in a closely packed manner.

Organic EL Elements and Organic EL Lighting

A top-emission type organic EL element and an organic EL lighting may be constructed by using the electrode foil of the present invention as a reflective electrode.

Figure 2:
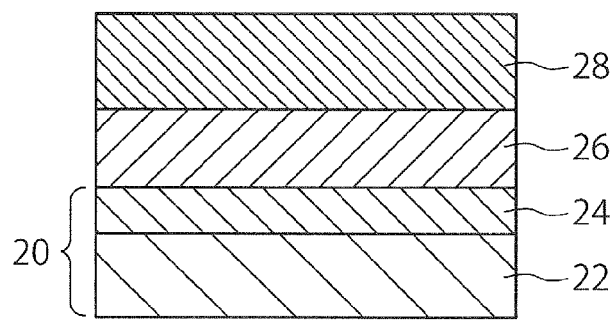
FIG. 2 is a schematic cross-sectional view illustrating a layer structure of an organic EL element in which the electrode foil according to the present invention is used as an anode.

FIG. 2 shows an example of a layer structure of a top-emission type EL element that uses the electrode foil of the present invention as an anode is shown. The EL element shown in FIG. 2 comprises an anodic electrode foil 20 comprising a metal foil 22 and a buffer layer 24, an organic EL layer 26 provided directly on the buffer layer 24, and a cathode 28 as a counter electrode provided directly on the organic EL layer 26. It is preferred that the buffer layer 24 be composed of a conductive amorphous carbon film or a conductive oxide film so as to be suitable as an anode.

The organic EL layer 26 may employ various known EL layer structures used for organic EL elements and may comprise optionally a hole injection layer and/or a hole transport layer, a light-emitting layer, and optionally an electron transport layer and/or an electron injection layer in this order in the direction from the anodic electrode foil 20 to the cathode 28. Any various known structures or compositions may be appropriately employed for each of the hole injection layer, the hole transport layer, the light-emitting layer, the electron transport layer, and the electron injection layer, without any particular limitation.

As described above, an organic solar cell may be constructed by replacing the organic EL layer 26 with a known organic solar cell active layer. In the case of an organic solar cell in which the electrode foil of the present invention is used as an anode, the solar cell can be constructed by laminating, on a buffer layer (for instance, a carbon buffer layer), a hole transport layer (PEDOT:PSS (30 nm)), a p-type organic semiconductor layer (for instance, BP (benzoporphyrin)), an i-type mixing layer (for instance, BP:PCBNB (fullerene derivative) of an n-type organic semiconductor and a p-type organic semiconductor, an n-type organic semiconductor layer (for instance, PCBM (fullerene derivative)), a buffer layer having a low work function (for instance, Mg—Ag), and a transparent electrode layer (for instance, IZO) in this order. Known materials may be appropriately used for each of these layers without any particular limitation. The electrode used for organic solar cells may have the same materials and structure as an the electrode used for organic EL elements. The electrode foil of the present invention has the function of a reflective layer and is thus expected to provide an increase in power generation efficiency due to light confinement caused by cavity effect.

Figure 3:
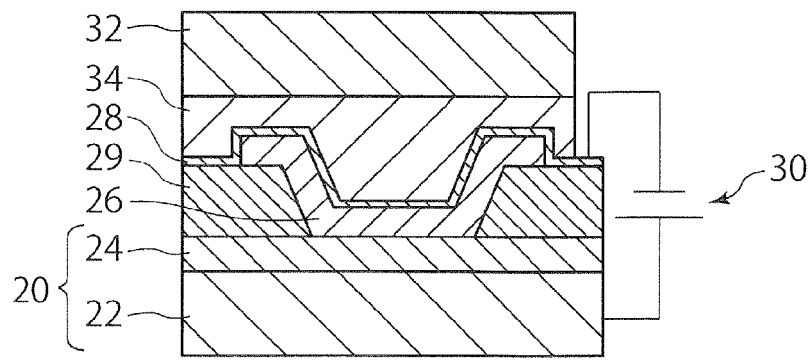
FIG. 3 is a schematic cross-sectional view illustrating an example of a top-emission type organic EL lighting according to the present invention.

FIG. 3 shows an example of a layer structure of a top-emission type organic EL lighting in which an organic EL element shown in FIG. 2 is incorporated. In the organic EL lighting shown in FIG. 3, the organic EL element is electrically connectable with a power source 30 through the metal foil 22 of the anodic electrode foil 20. On the buffer layer 24, the area that has no contact with the organic EL layer 26 is covered with an interlayer insulation film 29. The interlayer insulation film 29 is preferred to be a Si-based insulation film formed by CVD in that the film has a high barrier performance against water and oxygen that cause degradation of organic layers. A SiN-based insulation film is more preferable. A still more preferable interlayer insulation film is a SiNO-based insulation film in that the film has a small internal stress and an excellent bending performance.

On the upper side of the cathode 28, a sealing material 32 is provided as opposed to the organic EL element. The gap between the sealing material 32 and the organic EL element 20 is filled with a sealing resin to form a sealing film 34. As the sealing material 32, glass or films may be used. In the case of glass, the sealing material 32 may be bonded directly onto the sealing film 34 using a hydrophobic adhesive tape. In the case of films, both surfaces and end faces thereof may be covered with a Si-based insulating film. When a film having a high barrier performance will be developed in future, sealing will be possible without conducting coating treatment, and is expected to provide superior mass productivity. As the sealing material 32, films are preferable in terms of imparting flexibility. Nonetheless, a desired performance may be attained by using a sealing material formed by bonding a film to an extremely thin glass having a thickness of from 20 μm to 100 μm.

While various known cathodes used for top-emission type organic EL elements may be used as the cathode 28 without any particular limitation as long as they are transparent or translucent due to the necessity to transmit light, those having low work functions are preferred. Examples of preferable cathodes include conductive oxide films, magnesium alloy films, and fluoride films. A combination of two or more thereof is more preferable. For these films, films similar to those described with regard to the buffer layer of the electrode foil may be used.

A particularly preferable cathode has a two-layer structure in which a translucent metal layer as a buffer layer composed of a magnesium alloy film and/or a fluoride film is laminated onto a transparent oxide layer as a cathode layer composed of an conductive oxide film, being highly useful from the viewpoint of resistance as well. In this case, a high optical transparency and a low work function are provided by bringing the translucent metal layer (buffer layer) side of the cathode 28 into contact with the organic EL layer 26, thereby enhancing brightness and power efficiency of the organic EL element. A most preferable example is a cathode structure formed by laminating a transparent oxide layer (cathode layer) composed of IZO (indium zinc oxide) and a translucent metal layer (buffer layer) composed of Mg—Ag. In addition, the cathode structure may have two or more transparent oxide layers and/or two or more translucent metal layers. Thus, the light generated in the organic EL layer 26 passes through the cathode 28, the sealing film 34, and the sealing material 32, and is then emitted outside.

It is noted that, on the back side of the electrode foil 20, an auxiliary substrate may be appropriately provided depending on type of usage. The portion does not affect light emission performance, so that materials may be selected with a high degree of freedom. For instance, a resin film such as polyethylene terephthalate (PET), polyimide (PI), polycarbonate (PC), polyethersulfone (PES), and polyethernitrile (PEN) may be optimally used because flexibility is not impaired.

Figure 4:
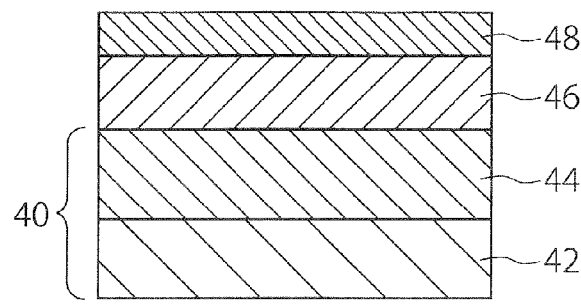
FIG. 4 is a schematic cross-sectional view illustrating a layer structure of an organic EL element in which the electrode foil according to the present invention is used as a cathode.

FIG. 4 shows an example of a layer structure of a top-emission type organic EL element in which the electrode foil of the present invention is used as a cathode. The organic EL element shown in FIG. 4 comprises a cathodic electrode foil 40 comprising a metal foil 42 and a buffer layer 44; an organic EL layer 46 provided directly on the buffer layer 44; and an anode 48 as a counter electrode provided directly on the organic EL layer 46. The organic EL layer 46 may be composed similarly to the organic EL layer 26 shown in FIG. 2. The buffer layer 44 may be composed similarly to the cathode 28 shown in FIG. 2, and preferably composed of a conductive oxide film, a magnesium alloy film, a fluoride film, or a combination of two or more thereof. More preferably, the buffer layer 44 is a translucent metal layer composed of a magnesium alloy film and/or a fluoride film.

Specifically, the organic EL element that uses cathodic electrode foil 40 shown in FIG. 4 corresponds to a structure in which an organic EL element using the anodic electrode foil 20 shown in FIG. 2 is modified by exchanging the buffer layer 24 and the cathode 28 and reversing the lamination order from the anode side to the cathode side inside the organic EL layer 26. For instance, it is preferable that a magnesium alloy film or a fluoride film as the buffer layer 44 of the cathodic electrode foil 40 is formed by sputtering or vapor deposition while a film made of conductive amorphous carbon, $MoO_3$, or $V_2O_5$ is formed as the anode 48 by vapor deposition. In particular, in the case of forming a conductive amorphous carbon film on the organic EL layer, vacuum deposition is preferably used in order to avoid plasma damage during sputtering.

EXAMPLES

The present invention will be further described in detail with reference to the following examples. Although the electrode foil of the present invention does not need a reflective layer, electrode foils with reflective layers will also be disclosed below for reference, because existence and absence of light emission in organic EL elements can be evaluated regardless of existence or absence of reflective layers.

Example 1

Preparation of Cu/Al-Alloy/ITO Electrode Foil

As a metal foil, 64-μm-thick commercially available both-side-flat electrolytic copper foil (DFF (Dual Flat Foil), manufactured by Mitsui Mining & Smelting Co., Ltd.) was prepared. The surface roughness of the copper foil was measured with a scanning probe microscope (Nano Scope V, manufactured by Veeco Instrument Inc.) in accordance with JIS B0601-2001, resulting in an arithmetic average roughness Ra of 12.20 nm. This measurement was performed in an area of 10 μm square using a Tapping Mode AFM.

The copper foil was subjected to CMP (Chemical Mechanical Polishing) treatment with a polishing machine manufactured by MAT Inc. This CMP treatment was performed by using a polishing pad having XY grooves and a colloidal silica polishing liquid under the conditions of pad rotation speed of 30 rpm; load of 200 gf/cm$^2$; and liquid supply rate of 100 cc/min. The copper foil thus treated with CMP was subjected to measurement of the surface roughness of the copper foil by using the scanning probe microscope (Nano Scope V, manufactured by Veeco Instruments Inc.) in accordance with JIS B 0601-2001, resulting in an arithmetic average roughness Ra of 0.7 nm. This measurement was performed in an area of 10 μm square using a Tapping Mode AFM. The thickness of the copper foil after the CMP treatment was 48 μm.

On the surface of the copper foil treated with CMP, an Al alloy reflective layer with a thickness of 150 nm was formed by sputtering. This sputtering was performed under the conditions of input power (DC) of 1,000 W (3.1 W/cm$^2$); ultimate vacuum of lower than $5 \times 10^{-5}$ Pa; sputtering pressure of 0.5 Pa; Ar flow rate of 100 sccm; and substrate temperature of room temperature, after mounting an aluminum alloy target (203.2 mm diameter and 8 mm thick) having a composition of Al-0.2B-3.2Ni (at %) in a magnetron sputtering apparatus (MSL-464, manufactured by Tokki Corp.) to which a cryopump was connected.

On the surface of an aluminum alloy reflective layer thus obtained, an ITO buffer layer with a thickness of 10 nm was formed by sputtering. This sputtering was performed under the conditions of input power (DC) of 300 W (0.9 W/cm$^2$); ultimate vacuum of lower than $5 \times 10^{-5}$ Pa; sputtering pressure of 0.35 Pa; Ar flow rate of 80 sccm; $O_2$ flow rate of 1.9 sccm; and substrate temperature at room temperature, after mounting an ITO ($In_2O_3$—$SnO_2$) target (203.2 mm diameter and 6 mm thick) containing 10 wt % of Sn in a magnetron sputtering apparatus (MSL-464, manufactured by Tokki Corp.) to which a cryopump was connected. Film thickness was controlled by regulating discharging time. The surface roughness of the buffer layer thus obtained was measured in the same manner as mentioned above, resulting in an arithmetic average roughness Ra of 2.0 nm. The total thickness of the resulting electrode foil was 48 μm.

Example 2

Preparation of Cu/Al-Alloy/C Electrode Foil

An electrode foil was prepared in the same manner as in Example 1 except that a carbon buffer layer with a thickness of 1.7 nm or 3.5 nm was formed by sputtering in place of the ITO buffer layer. As a carbon target for the sputtering, two types of carbon targets were prepared including a non-treated carbon target with a purity of 3N (99.9%) made from a carbon material (IGS743, manufactured by Tokai Carbon Co., Ltd.); and a carbon target having a purity of 5N (99.999%) made from the above carbon material through purification treatment with a halogen gas. By using each of these targets, the carbon buffer layer was formed by sputtering. This sputtering was performed under the conditions of input power (DC) of 250 W (0.8 W/cm$^2$); ultimate vacuum of lower than $5 \times 10^{-5}$ Pa; sputtering pressure of 0.5 Pa; Ar flow rate of 100 sccm; and substrate temperature at room temperature, after mounting each carbon target (203.2 mm diameter and 8 mm thick) in a magnetron sputtering apparatus (Multi-chamber sheet-fed-type film formation apparatus MSL-464, manufactured by Tokki Corp.) to which a cryopump was connected. Film thickness was controlled by regulating discharging time. The surface roughness of the buffer layer thus obtained was measured in the same manner as in Example 1, resulting in an arithmetic average roughness Ra of 2.45 nm. The total thickness of the resulting electrode foil was 48 μm.

Example 3

Preparation of Cu/C Electrode Foil

An electrode foil having a carbon buffer layer was prepared in the same manner as in Example 2 except that the Al alloy reflective layer was not formed. The surface roughness of the buffer layer thus obtained was measured in the same manner as in Example 1, resulting in an arithmetic average roughness Ra of 1.42 nm. The total thickness of the resulting electrode foil was 48 μm.

Example 4

Preparation of Cu/Ag-Alloy/ITO Electrode Foil

An electrode foil having a buffer layer and a reflective layer was prepared in the same manner as in Example 1 except that an Ag alloy reflective layer with a thickness of 150 nm was formed by sputtering in place of the Al alloy reflective layer. This sputtering was performed under the conditions of input power (DC) of 150 W (1.9 W/cm$^2$); ultimate vacuum of lower than $5 \times 10^{-5}$ Pa; sputtering pressure of 0.5 Pa; Ar flow rate of 90 sccm; and substrate temperature at room temperature, after mounting a silver alloy target (101.6 mm diameter and 5 mm thick) having a composition of Ag-1.0Cu-1.0Pd (at %) on a magnetron sputtering apparatus (MSL-464, manufactured by Tokki Corp.) to which a cryopump was connected. Film thickness was controlled by regulating discharging time.

Example 5

Fabrication of Organic EL Element

An organic EL element having a structure as shown in FIGS. 2 and 3 was prepared by using as an anode the electrode foil (Cu/Al-alloy/ITO) prepared in Example 1. At the outset, a glass plate (3 cm square and 0.5 mm thick) was put on the electrode foil 20 (5 cm square) so as to make masking, followed by formation of an interlayer insulation film 29 composed of silicon nitride by plasma CVD (Chemical Vapor Deposition). This plasma CVD was performed under the conditions of film forming area of 8 inch diameter in terms of effective area; input power (RF) of 250 W (0.8 W/cm$^2$);

ultimate vacuum of lower than 5×10⁻³ Pa; sputtering pressure of 80 Pa; gas flow rate of $SiH_4$ (diluted with $H_2$ to 10%):$NH_3$:$N_2$=100:10:200 sccm; and substrate temperature at 250° C., using a plasma CVD apparatus (PD-2202L, manufactured by Samco Inc.) to which a mechanical booster pump (MBP) and a rotary pump (RP) were connected. The glass was then removed from the electrode foil 20 to obtain an interlayer insulation film 29 having an opening of 3 cm square on the electrode foil.

The surface of the electrode foil having the interlayer insulation film formed thereon was cleansed as follows. First, ultrasonic cleansing for 3 minute was performed twice in a bath filled with an ultrapure water (having larger than 18.0 MΩ) being replaced with a fresh one for the second cleansing. Subsequently, after water was removed by using nitrogen gas, after-curing was performed at 100° C. for 3 hours. The surface thus treated was cleansed by UV irradiation.

Figure 5:
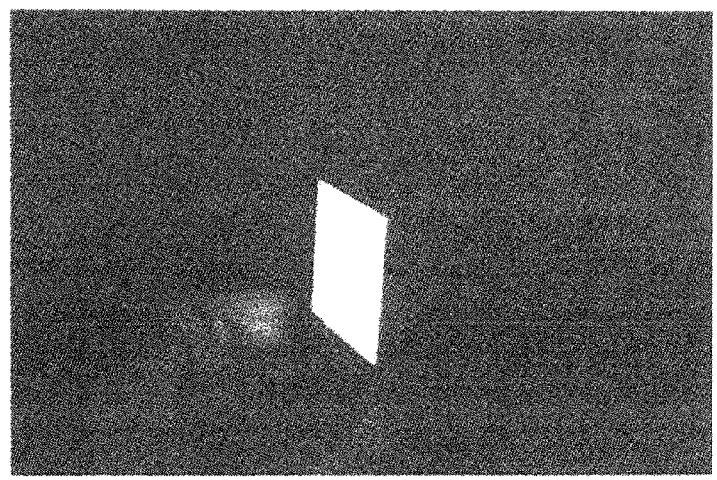
FIG. 5 is a photograph showing a light-emitting appearance of an organic EL element prepared in Example 5.
Figure 6:
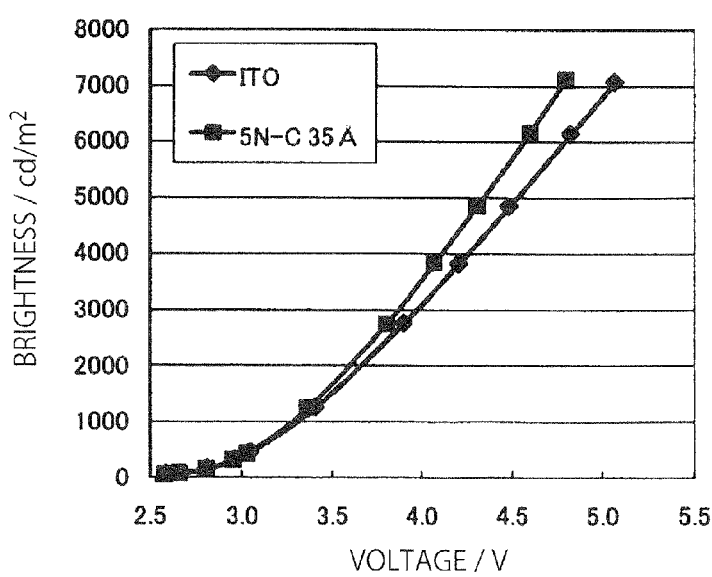
FIG. 6 is a graph showing the voltage dependence of brightness measured in Examples 5 and 6.
Figure 7:
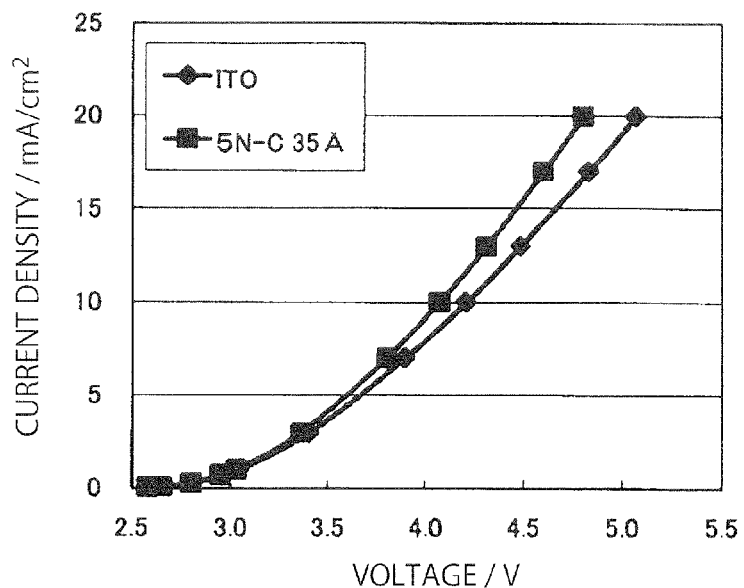
FIG. 7 is a graph showing the voltage dependence of current density measured in Examples 5 and 6.

On the electrode foil thus cleansed, an organic EL layer 26, a cathode 28, a sealing layer 34, and a sealing material 32 were laminated. Specifically, on the buffer layer surface of the electrode foil, a 50-nm-thick hole injection layer composed of copper phthalocyanine, a 40-nm-thick hole transport layer composed of 4,4'-bis(N,N'-(3-tolyl)amino)-3,3'-dimethylbiphenyl (HMTPD), a 30-nm-thick light emitting layer composed of a host material doped with tris(2-phenylpyridine) iridium complex (Ir(ppy)$_3$), a 30-nm-thick electron transport layer composed of Alq3, a 10-nm-thick translucent layer composed of Mg—Ag (Mg:Ag=9:1), a 100-nm-thick transparent oxide layer composed of IZO (In—Zn—O), a 300-nm-thick passivation film (sealing layer) composed of silicon nitride, a 2,000-nm-thick adhesive layer, and a 200-μm-thick sealing glass (sealing material) were laminated in this order. The lamination of the sealing glass was conducted by using a double-stick tape, which corresponds to the adhesive layer. In this way, there was obtained an organic EL element sample as shown in FIG. 3, which was 50 mm square and 300 μm thick and had a light-emitting area of 30 mm square. When this sample was connected to a power source 30 and then applied with a voltage of 5.0 V, an intense light emission as shown in FIG. 5 was observed. In addition, when the applied voltage was varied to measure the change in brightness (cd/cm²) and current density (mA/cm²), there were obtained results shown in FIGS. 6 and 7 (see the plots denoted by "ITO" in these figures). As described above, the use of the electrode foil of the present invention enables light emission with an extremely high brightness at low voltages.

In addition, organic EL elements were prepared and evaluated in the same way as described above, by using electrode foils prepared under the same conditions as those of Example 1 except that the surface roughness Ra of the copper foil was made 6.8 nm or 4.5 nm by changing the CMP treatment time. Even in these organic EL elements thus obtained, light emission was confirmed with no occurrence of short circuit.

For comparison, when an organic EL element was prepared and applied with current in the same way as described above by using a both-side-flat electrolytic copper foil with an arithmetic average roughness Ra of 12.20 nm used in Example 1, short circuit occurred between the electrodes, failing to emit light.

Example 6

Fabrication of Organic EL Element

Three types of organic EL element samples were prepared in the same way as in Example 5 except for using electrode foils (Cu/Al-alloy/C) having the following three kinds of carbon buffer layers prepared in Example 2.

Sample "5N-C 35 Å" is an organic EL element having a 3.5-nm-thick carbon buffer layer formed by using a carbon target having a purity of 5N, Sample "3N-C 17 Å" is an organic EL element having a 1.7-nm-thick carbon buffer layer formed by using a carbon target having a purity of 3N, and Sample "5N-C 17 Å" is an organic EL element having a 1.7-nm-thick carbon buffer layer formed by using a carbon target having a purity of 5N.

Figure 8:
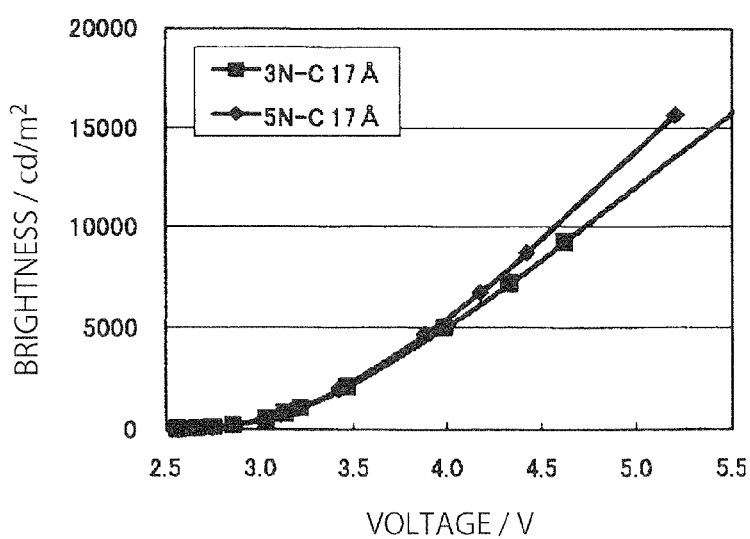
FIG. 8 is a graph showing the voltage dependence of brightness measured in Example 6.

Each of the above samples was connected to the power source 30 as shown in FIG. 3. When the applied voltage was varied to measure the change in brightness (cd/cm²) and/or current density (mA/cm²), there were obtained results shown in FIGS. 6 to 8. As described above, the use of the electrode foil of the present invention enables light emission with an extremely high brightness at low voltages.

Example 7

Fabrication of Organic EL Element

An organic EL element was prepared in the same manner as in Example 5 except that an electrode foil having no reflective layer (Cu/C) prepared in Example 3 was used. When this sample was connected to the power source to apply a voltage of 5.0 V, a strong light emission was able to be confirmed. This indicates that the electrode foil can be used for an organic EL lighting even without a reflective layer.

Example 8

Measurement of Wavelength Dependency of Absolute Reflectivity

An absolute-reflectivity measuring apparatus was used to measure absolute reflectivity on various metal foils shown below:

Untreated copper foil: both-side-flat electrolytic copper foil (DFF (Dual Flat Foil), manufactured by Mitsui Mining & Smelting Co., Ltd.; Ra: 12.20 nm); and Ultra-smoothed copper foil: a copper foil which underwent a CMP treatment in the same manner as in Example 1 (Ra: 0.7 nm); and A reflective aluminum alloy: an aluminum alloy having a composition of Al-0.2B-3.2Ni (at %) (Ra: 1.8 nm).

Figure 9:
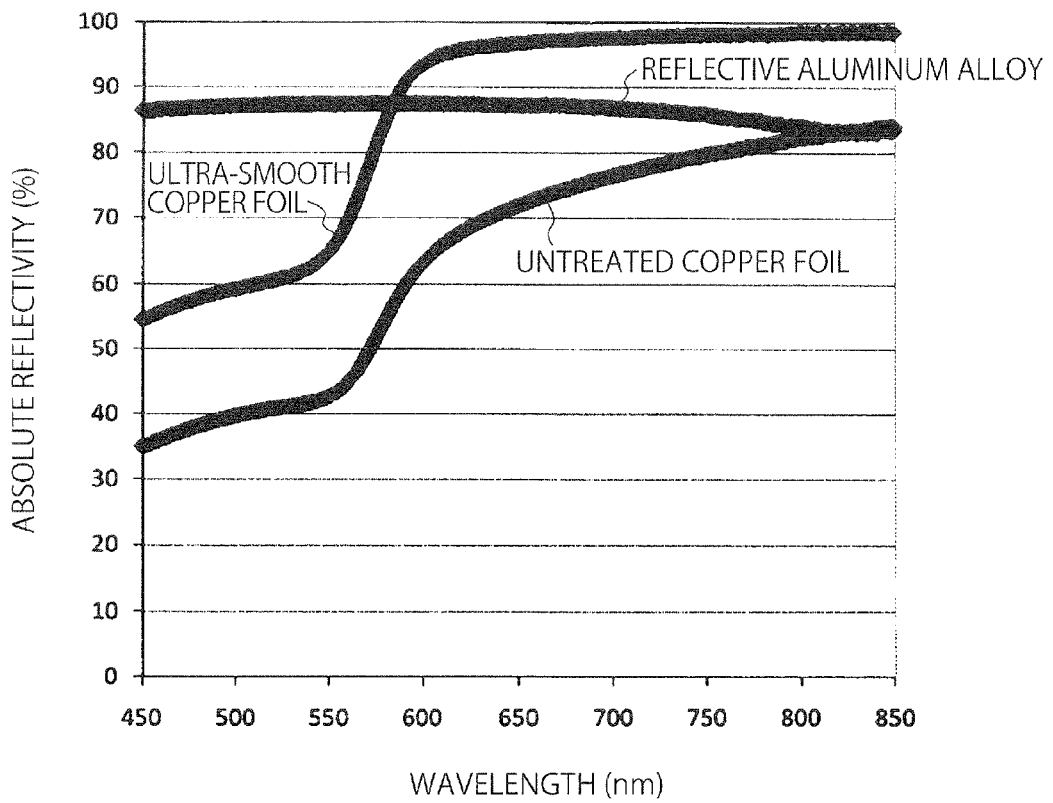
FIG. 9 is a graph showing the wavelength dependences of absolute reflectivity (%) measured on various metal foils in Example 8.

The measured results are shown in FIG. 9. These results indicate that the surface-smoothed copper foil exhibits a significantly higher absolute reflectivity than untreated copper foil which does not undergo the CMP treatment. It is also understood that, unlike the aluminum alloy exhibiting extremely high absolute reflectivity over the entire wavelength region, the ultra-smoothed copper foil can reflect a warm white light with a color temperature of about 3000 K that is highly needed for organic EL lighting because the absolute reflectivity becomes relatively lower in the blue wavelength region than in the other wavelength region.

Example 9

Preparation of Cu/Al-Alloy Electrode Foil

Figure 10:
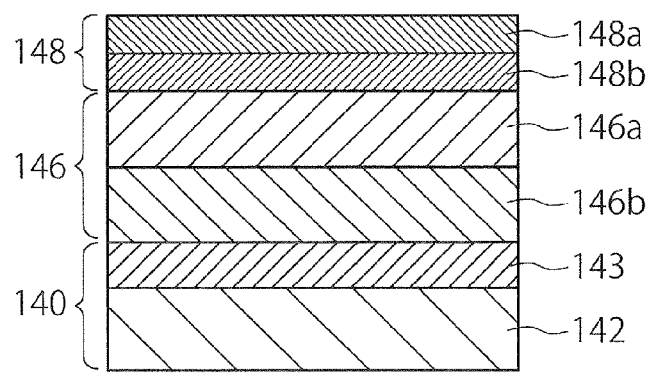
FIG. 10 is a schematic cross-sectional view illustrating the layer structure of the electrode foil prepared in Example 9.

As shown in FIG. 10, on the copper foil 142 that had been prepared under the same conditions as in Example 1, an Al alloy reflective layer 143 with a thickness of 150 nm was prepared by sputtering. This sputtering was performed under the conditions of input power (DC) of 1,000 W (3.1 W/cm$^2$); ultimate vacuum of lower than $5\times10^{-5}$ Pa; sputtering pressure of 0.5 Pa; Ar flow rate of 100 sccm; and substrate temperature at room temperature, after mounting an aluminum alloy target (203.2 nm diameter and 8 mm thick) having a composition of Al-4Mg (at %) on a magnetron sputtering apparatus (MSL-464, manufactured by Tokki Corp.) to which a cryopump was connected. In this way, there was obtained an electrode foil 140 that may be used as a cathodic electrode in an organic EL element.

Example 10

Fabrication of Organic EL Element

Figure 11:
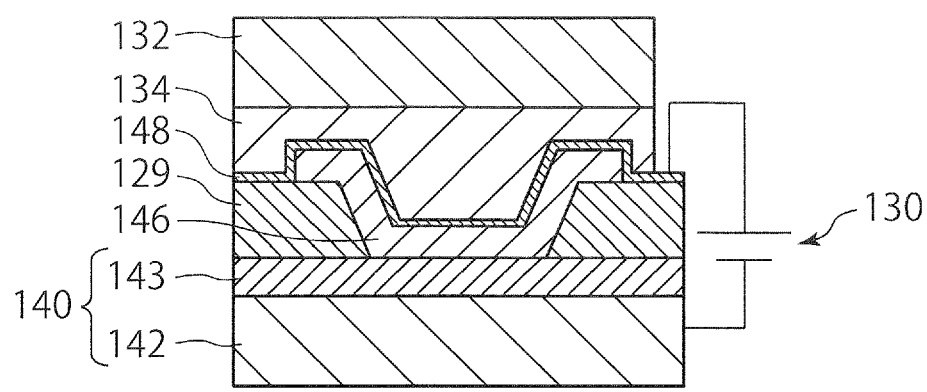
FIG. 11 is a schematic cross-sectional view illustrating the layer structure of the organic EL element prepared in Example 10.

An organic EL element having a structure as shown in FIGS. 10 and 11 was prepared by using as a cathode the electrode foil 140 (Cu/Al alloy) prepared in Example 9. At the outset, a glass plate (3 cm square and 0.5 mm thick) was put on the electrode foil 140 (5 cm square) so as to make masking, followed by formation of an interlayer insulation film 129 composed of silicon nitride by plasma CVD (Chemical Vapor Deposition). This plasma CVD was performed under the conditions of film forming area of 8 inch diameter in terms of effective area; input power (RF) of 250 W (0.8 W/cm$^2$); ultimate vacuum of lower than $5\times10^{-3}$ Pa; sputtering pressure of 80 Pa; gas flow rate of SiH$_4$ (diluted with H$_2$ into 10%): NH$_3$:N$_2$=100:10:200 sccm; and substrate temperature at 250° C., using a plasma CVD apparatus (PD-2202L, manufactured by Samco Inc.) to which a mechanical booster pump (MBP) and a rotary pump (RP) were connected. The glass was then removed from the electrode foil 140 to obtain an interlayer insulation film 129 having an opening of 3 cm square on the electrode foil.

On the electrode foil 140 thus cleansed, an organic EL layer 146, an anode 148, a sealing layer 134, and a sealing material 132 were laminated. Specifically, on the surface of the reflective layer 144 of the electrode foil, a 50-nm-thick α-NPD layer 146*b*, a 50-nm-thick Alq3 layer 146*a*, a 20-nm-thick MoO$_3$ layer 148*b*, a 100-nm-thick IZO (In—Zn—O) transparent oxide layer 148*a*, a 300-nm thick silicon nitride passivation film (sealing layer 134), a 2,000-nm-thick adhesive layer, and a 200-μm-thick sealing glass (sealing material 132) were laminated in this order. The lamination of the sealing glass was conducted by using a double-stick tape, which corresponds to the adhesive layer. In this way, there was obtained a sample of an organic EL element as shown in FIG. 11, which was 50 mm square and 300 μm thick and had a light-emitting area of 30 mm square. When this sample was connected to a power source 130 and then applied with a voltage of 10 V, an emission of green light generated from Alq3 was confirmed.

The invention claimed is:

1. An electrode foil comprising a copper foil, wherein the electrode foil has at least one outermost surface which is an ultra-smooth surface having an arithmetic average roughness Ra of 7.0 nm or less as measured in accordance with JIS B 0601-2001.

2. The electrode foil according to claim 1, wherein the arithmetic average roughness Ra is 3.0 nm or less.

3. The electrode foil according to claim 1 for use as an anode or a cathode in an organic EL element or an organic solar cell.

4. The electrode foil according to claim 1, which is free from an insulating layer at least on or to the side of the ultra-smooth surface.

5. The electrode foil according to claim 1, wherein the copper foil has a thickness of from 1 μM to 250 μm.

6. The electrode foil according to claim 1, wherein the copper foil is a nonmagnetic metal foil.

7. The electrode foil according to claim 1, further comprising a transparent or translucent buffer layer directly provided on the copper foil, wherein the surface of the buffer layer constitutes the ultra-smooth surface.

8. The electrode foil according to claim 7, wherein the buffer layer is at least one selected from the group consisting of a conductive amorphous carbon film, an conductive oxide film, a magnesium alloy film, and a fluoride film.

9. The electrode foil according to claim 1, having a thickness of from 1 μm to 300 μm.

10. The electrode foil according to claim 1, wherein a surface of the copper foil opposite to the ultra-smooth surface is a roughened surface having a ten-point average roughness Rz of 1.0 μm or more as measured in accordance with JIS B 0601-1994.

11. An organic device which is an organic EL element and/or an organic solar cell, the organic device comprising:
the electrode foil according to claim 1;
an organic semiconductor layer comprising an organic EL layer and/or an organic solar cell active layer, the organic semiconductor layer being provided directly on the outermost surface on or to the side of the ultra-smooth surface of the electrode foil; and
a transparent or translucent counter electrode provided on the organic semiconductor layer.

12. The organic device according to claim 11, wherein the counter electrode comprises at least one selected from the group consisting of an conductive amorphous carbon film, an conductive oxide film, a magnesium alloy film, and a fluoride film.

13. An organic EL lighting comprising the organic device according to claim 11 as an organic EL element.

14. A copper foil comprising at least one surface having an arithmetic average roughness Ra of 7.0 nm or less as measured in accordance with JIS B 0601-2001.

15. The copper foil according to claim 14, wherein the arithmetic average roughness Ra is 3.0 nm or less.

* * * * *